(12) United States Patent
Harada et al.

(10) Patent No.: US 11,756,603 B2
(45) Date of Patent: Sep. 12, 2023

(54) MEMORY-ELEMENT-INCLUDING SEMICONDUCTOR DEVICE

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/717,779

(22) Filed: Apr. 11, 2022

(65) Prior Publication Data
US 2022/0336002 A1    Oct. 20, 2022

(30) Foreign Application Priority Data

Apr. 15, 2021  (WO) .................. PCT/JP2021/015527

(51) Int. Cl.
| | | |
|---|---|---|
| *G11C 11/402* | (2006.01) | |
| *G11C 11/4097* | (2006.01) | |
| *G11C 5/10* | (2006.01) | |

(52) U.S. Cl.
CPC .......... *G11C 11/4023* (2013.01); *G11C 5/10* (2013.01); *G11C 11/4097* (2013.01)

(58) Field of Classification Search
CPC ... G11C 11/4023; G11C 5/10; G11C 11/4097; G11C 5/025; G11C 16/02; G11C 16/10;
(Continued)

(56) References Cited

U.S. PATENT DOCUMENTS

| 6,548,848 B2 * | 4/2003 | Horiguchi ............. H10B 12/20 257/317 |
|---|---|---|
| 2002/0114191 A1 | 8/2002 | Iwata et al. |

(Continued)

FOREIGN PATENT DOCUMENTS

| JP | H 02-188966 A | 7/1990 |
|---|---|---|
| JP | H 03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Allison Bernstein
(74) *Attorney, Agent, or Firm* — Crowell & Moring LLP

(57) ABSTRACT

On a substrate, dynamic flash memory cell transistors and, on their outside, driving-signal processing circuit transistors are disposed. A source line wiring layer, a bit line wiring layer, a plate line wiring layer, and a word line wiring layer extend in the horizontal direction relative to the substrate and connect, from the outside of a dynamic flash memory region, in the perpendicular direction, to lead-out wiring layers on an insulating layer. The transistors in driving-signal processing circuit regions connect, via multilayered wiring layers, to upper wiring layers on the insulating layer. A high-thermal-conductivity layer is disposed over the entirety of the dynamic flash memory region and in a portion above the bit line wiring layer.

7 Claims, 11 Drawing Sheets

(58) Field of Classification Search
CPC ....... G11C 16/14; G11C 16/26; G11C 11/404; H10B 12/036; H10B 12/05; H10B 12/33; H10B 12/50
See application file for complete search history.

(56) References Cited

U.S. PATENT DOCUMENTS

| | | |
|---|---|---|
| 2003/0111681 A1 | 6/2003 | Kawanaka |
| 2008/0137394 A1 | 6/2008 | Shimano |
| 2009/0294833 A1* | 12/2009 | Kim ............... H10B 12/50 257/324 |
| 2011/0116316 A1 | 5/2011 | Ueda |
| 2013/0141858 A1 | 6/2013 | Pyeon |
| 2015/0325444 A1 | 11/2015 | Masuoka et al. |
| 2017/0040329 A1 | 2/2017 | Masuoka et al. |

FOREIGN PATENT DOCUMENTS

| | | |
|---|---|---|
| JP | 2003-86712 A | 3/2003 |
| JP | 2003-188279 A | 7/2003 |
| JP | 3957774 B2 | 8/2007 |
| JP | 2008-147514 A | 6/2008 |
| JP | 2015-502663 A | 1/2015 |
| WO | WO 2009/090892 A1 | 7/2009 |
| WO | WO 2014/184933 A1 | 11/2014 |

OTHER PUBLICATIONS

H. Chung, H. Kim, H. Kim, K. Kim, S. Kim, K. Dong, J. Kim, Y.C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI,"IEICE Trans. Electron., vol. E90-C., No. 4 pp. 765-771 (2007).

Asen Asenov, Binjie Cheng, Xingsheng Wang, Andrew Robert Brown, Campbell Millar, Craig Alexander, Salvatore Maria Amoroso, Jente B. Kuang, and Sani R. Nassif,"Variability Aware Simulation Based Design-Technology Cooptimization (DTCO) Flow in 14 nm FinFET/SRAM Cooptimization,"IEEE Transaction on Electron Devices, vol. 62,No. 6(2015).

Initial Patent Examination Report from PCT/JP2021/015527, dated Apr. 15, 2021, 5 pgs.

F. Morishita, H. Noda, I. Hayashi, T. Gyohten, M. Okamoto, T. Ipposhi, S. Maegawa, K. Dosaka, and K. Arimoto: "Capacitorless Twin-Transistor Random Access Memory (TTRAM) on SOI,"IEICE Trans. Electron., vol. E90-c., No. 4 pp. 765-771 (2007), (a brief description attached).

* cited by examiner

"1" Write State

"0" Erase Operation

Vb: Built-in Voltage~0.7V
Built-in Voltage ~0.7V

FIG.4AA   "1" Write State
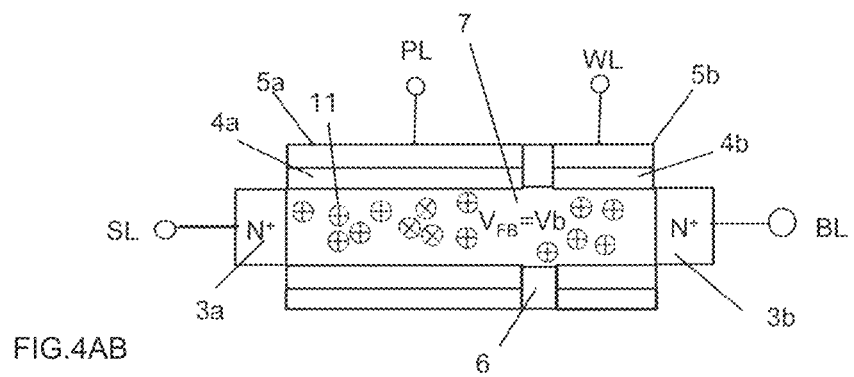
FIG.4AB   "0" Erase State
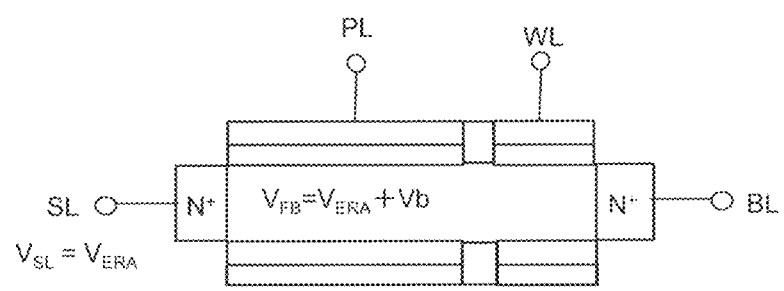
Vb: Built-in Voltage ~0.7V
FIG.4AC
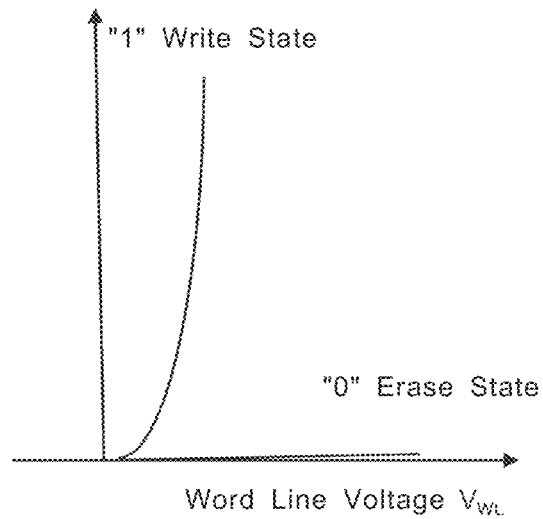

FIG.4BA
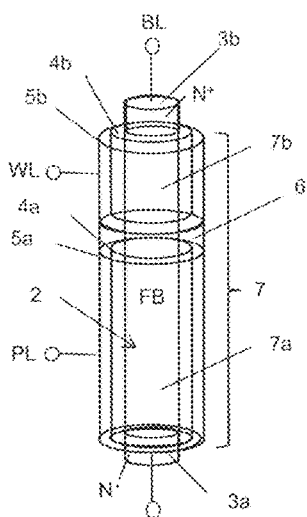
FIG.4BB
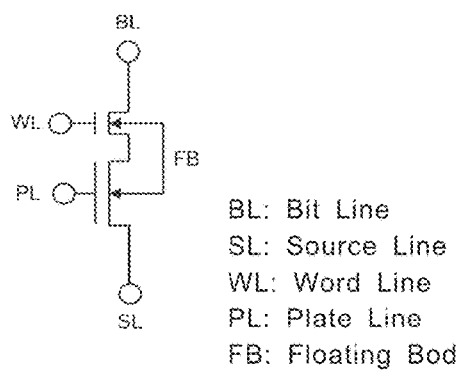
BL: Bit Line
SL: Source Line
WL: Word Line
PL: Plate Line
FB: Floating Body
FIG.4BC
FIG.4BD
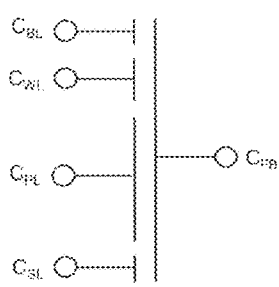
$C_{FB} = C_{PL} + C_{WL} + C_{BL} + C_{SL}$
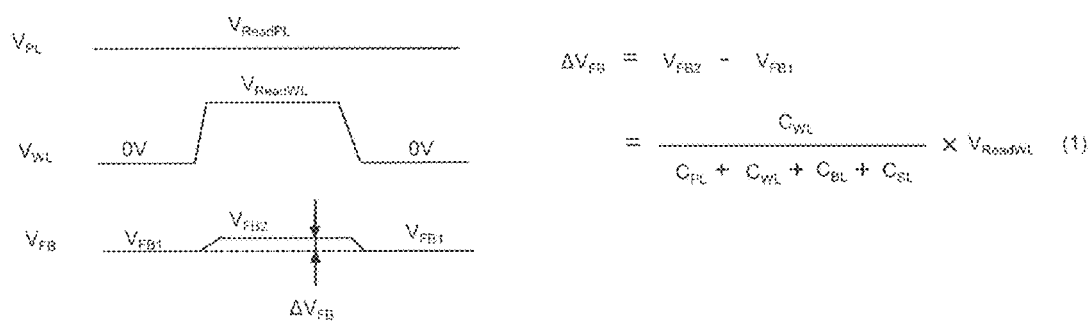
$$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

$C_{FB} = C_{WL} + C_{BL} + C_{SL}$  Formula (2)

$\Delta V_{FB} = V_{FB2} - V_{FB1}$ $= \dfrac{C_{WL}}{C_{WL} + C_{BL} + C_{SL}} \times V_{ProgWL}$  Formula (3)

$\beta = \dfrac{C_{WL}}{C_{WL} + C_{BL} + C_{SL}}$  Formula (4)

MEMORY-ELEMENT-INCLUDING SEMICONDUCTOR DEVICE

CROSS-REFERENCE TO RELATED APPLICATIONS

This application claims priority claims priority under 35 U.S.C. § 119(a) to PCT/JP2021/015527 filed on Apr. 15, 2021, the entire content of which is incorporated herein by reference.

TECHNICAL FIELD

The present invention relates to a memory-element-including semiconductor device.

BACKGROUND ART

In recent years, in development of the LSI (Large Scale Integration) technology, there has been a demand for memory-element-including semiconductor devices having a higher degree of integration and higher performance.

In the ordinary planar MOS transistor, the channel extends, along the upper surface of the semiconductor substrate, in the horizontal direction. By contrast, the channel of the SGT extends in a direction perpendicular to the upper surface of the semiconductor substrate (refer to, for example, Patent Literature 1 and Non Patent Literature 1). For this reason, the SGT enables, compared with the planar MOS transistor, an increase in the density of the semiconductor device. Use of this SGT as a select transistor enables a higher degree of integration in, for example, a DRAM (Dynamic Random Access Memory, refer to, for example, Non Patent Literature 2) to which a capacitor is connected, a PCM (Phase Change Memory, refer to, for example, Non Patent Literature 3) to which a resistance change element is connected, an RRAM (Resistive Random Access Memory, refer to, for example, Non Patent Literature 4), and an MRAM (Magneto-resistive Random Access Memory, refer to, for example, Non Patent Literature 5) in which a current is used to change the orientation of the magnetic spin to change the resistance. In addition, there is a capacitor-less DRAM memory cell constituted by a single MOS transistor (refer to Non Patent Literature 6), for example. The present application relates to a semiconductor device including a dynamic flash memory that does not include resistance change elements or capacitors and can be constituted by a MOS transistor alone.

For the above-described capacitor-less DRAM memory cell constituted by a single MOS transistor, FIGS. 8A-8D illustrate the write operation, FIGS. 9A-9B illustrate a problem in the operation, and FIGS. 10A-10C illustrate the read operation (refer to Non Patent Literatures 6 to 10).

FIG. 8A-8D illustrate the write operation of the DRAM memory cell. FIG. 8A illustrates the "1" write state. This memory cell is formed on an SOI substrate 101, and is constituted by a source N$^+$ layer 103 (hereafter, semiconductor regions containing donor impurities at high concentrations will be referred to as "N$^+$ layers") to which a source line SL is connected, a drain N$^+$ layer 104 to which a bit line BL is connected, a gate conductive layer 105 to which a word line WL is connected, and a floating body (Floating Body) 102 of a MOS transistor 110a; thus, the capacitor-less DRAM memory cell is constituted by the single MOS transistor 110a. Note that the floating body 102 is in contact with the immediately underlying layer, the SiO$_2$ layer 101 of the SOI substrate. In the memory cell constituted by the single MOS transistor 110a, in order to write "1", the MOS transistor 110a is operated in the saturation region. Specifically, an electron channel 107 extending from the source N$^+$ layer 103 has a pinch-off point 108 and does not reach the drain N$^+$ layer 104 to which the bit line is connected. Thus, when the MOS transistor 110a is operated such that the bit line BL connected to the drain N$^+$ layer 104 and the word line WL connected to the gate conductive layer 105 are set at high voltages, and the gate voltage is set at about ½ of the drain voltage, the electric field strength becomes maximum at the pinch-off point 108 near the drain N$^+$ layer 104. As a result, accelerated electrons flowing from the source N$^+$ layer 103 to the drain N$^+$ layer 104 collide with the Si lattice, and the kinetic energy lost at this time causes generation of electron-hole pairs. Most of the generated electrons (not shown) reach the drain N$^+$ layer 104. A very small portion of the electrons, very hot electrons jump over a gate oxide film 109, to reach the gate conductive layer 105. Holes 106 generated at the same time charge the floating body 102. In this case, the generated holes contribute, in the floating body 102 formed of P-type Si, as an increment of the majority carrier. When the floating body 102 is filled with the generated holes 106 and the voltage of the floating body 102 becomes higher than that of the source N$^+$ layer 103 by Vb or more, holes further generated are discharged to the source N$^+$ layer 103. Vb is the built-in voltage of the PN junction between the source N$^+$ layer 103 and the P-layer floating body 102, and is about 0.7 V. FIG. 8B illustrates a state in which the floating body 102 is charged to saturation with the holes 106 generated.

Hereinafter, with reference to FIG. 8C, the "0" write operation of the memory cell 110 will be described. For the common select word line WL, there are randomly a memory cell 110a to which "1" is written and a memory cell 110b to which "0" is written. FIG. 8C illustrates a state of a rewrite from a "1" write state to a "0" write state. In order to write "0", the voltage of the bit line BL is set to a negative bias and the PN junction between the drain N$^+$ layer 104 and the P-layer floating body 102 is forward biased. As a result, the holes 106 generated in advance in the floating body 102 in the previous cycle flow to the drain N$^+$ layer 104 connected to the bit line BL. Completion of the write operation provides two states of memory cells that are the memory cell 110a filled with the generated holes 106 ((b) in the drawing) and the memory cell 110b from which the generated holes have been discharged ((c) in the drawing). In the memory cell 110a filled with the holes 106, the floating body 102 has a higher potential than the floating body 102 not having generated holes. Thus, the threshold voltage of the memory cell 110a becomes lower than the threshold voltage of the memory cell 110b. This state is illustrated in FIG. 8D.

Hereinafter, a problem in the operation of the memory cell constituted by a single MOS transistor will be described with reference to FIGS. 9A-9B. As illustrated in FIG. 9A, the capacitance $C_{FB}$ of the floating body 102 is the sum of the capacitance $C_{WL}$ between the gate to which the word line is connected and the floating body 102, the junction capacitance $C_{SL}$ of the PN junction between the source N$^+$ layer 103 to which the source line is connected and the floating body 102, and the junction capacitance $C_{BL}$ of the PN junction between the drain N$^+$ layer 103 to which the bit line is connected and the floating body 102, and is expressed as follows.

$$C_{FB}=C_{WL}+C_{BL}+C_{SL} \qquad (2)$$

Thus, a change in the word line voltage $V_{WL}$ at the time of writing affects the voltage of the floating body 102 serving as the storage node (contact point) of the memory cell. This state is illustrated in FIG. 9B. At the time of writing, an increase in the word line voltage $V_{WL}$ from 0 V to $V_{ProgWL}$ results in an increase in the voltage $V_{FB}$ of the floating body 102 from the initial voltage $V_{FB1}$ of the original word line voltage to $V_{FB2}$ due to capacitive coupling with the word line. The voltage change amount $\Delta V_{FB}$ is expressed as follows:

$$\Delta V_{FB} = V_{FB2} - V_{FB1} = C_{WL}/(C_{WL} + C_{BL} + C_{SL}) \times V_{ProgWL} \qquad (3)$$

where $$\beta = C_{WL}/(C_{WL}+C_{BL}+C_{SL}) \qquad (4)$$

is expressed and $\beta$ is referred to as a coupling ratio. In such a memory cell, $C_{WL}$ has a high contribution ratio and, for example, $C_{WL}:C_{BL}:C_{SL}=8:1:1$. In this case, $\beta=0.8$. When the word line changes, for example, from 5 V at the time of writing to 0 V at the end of writing, the capacitive coupling between the word line and the floating body 102 causes an amplitude noise as much as 5 V×$\beta$=4 V on the floating body 102. Thus, the potential difference margin is not sufficiently provided between the "1" potential and the "0" potential of the floating body at the time of writing, which is a problem.

FIGS. 10A-10C illustrate the read operation. FIG. 10A illustrates the "1" write state, and FIG. 10B illustrates the "0" write state. However, actually, even when "1" is written to write Vb in the floating body 102, returning of the word line to 0 V upon completion of writing brings the floating body 102 to a negative bias. When "0" is written, lowering to a further negative bias is caused, so that, at the time of writing, the potential difference margin between "1" and "0" cannot be made sufficiently large. This small operation margin is a major problem of the DRAM memory cell. In addition, formation of a peripheral circuit for driving the DRAM memory cell, on the same substrate, needs to be achieved.

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[NPL 7] J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012)
[NPL 8] T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002).
[NPL 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[NPL 10] E. Yoshida: "A Capacitorless 1T-DRAM Technology Using Gate-Induced Drain-Leakage (GIDL) Current for Low-Power and High-Speed Embedded Memory," IEEE IEDM (2006).
[NPL 11] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.
[NPL 12] Asen Asenov, Binjie Cheng, XingshengWang, Andrew Robert Brown, Campbell Millar, Craig Alexander, Salvatore Maria Amoroso, Jente B. Kuang, and Sani R. Nassif, "Variability Aware Simulation Based Design-Technology Cooptimization (DTCO) Flow in 14 nm FinFET/SRAM Cooptimization," IEEE Transaction on Electron Devices, Vol. 62, No. 6 (2015)
[NPL 13] J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, May 2006.
[NPL 14] N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.

SUMMARY OF INVENTION

Technical Problem

In an SGT-including memory device that is a capacitor-less single-transistor DRAM (gain cell), capacitive coupling between the word line and the floating SGT body is strong; at the time of reading or writing of data, a change in the potential of the word line is transmitted directly as noise to the SGT body, which has been problematic. This causes problems of erroneous reading or erroneous writing of storage data and makes it difficult to put the capacitor-less single-transistor DRAM (gain cell) into practical use. The above-described problems need to be addressed and, on the substrate of the memory cell, a peripheral circuit for driving the memory cell also needs to be formed at a high density and at low costs.

Solution to Problem

In order to address such problems, a memory-element-including semiconductor device according to the present invention includes:

a dynamic flash memory region in which, on a substrate, a plurality of dynamic flash memory cells are arranged in a two-dimensional array, and a signal processing-driving circuit region disposed outside of the dynamic flash memory region and including a plurality of transistors configured to perform signal processing-driving of the plurality of dynamic flash memory cells, wherein each of the dynamic flash memory cells included in the dynamic flash memory region includes a semiconductor pillar standing on the substrate in a direction perpendicular to the substrate, a first impurity layer connecting to a bottom portion of the semiconductor pillar, a second impurity layer connecting to a top portion of the semiconductor pillar, a first gate insulating layer surrounding a lower portion of the semiconductor pillar and being in contact with the first impurity layer, a second gate insulating layer being in contact with the first gate insulating layer, surrounding an upper portion of the semiconductor pillar, and being in contact with the second impurity layer, a first gate conductor layer covering a portion of or an entirety of the first gate insulating layer, a second gate conductor layer covering the second gate insulating layer, and a first insulating layer disposed between the first gate conductor layer and the second gate conductor layer, and is configured to control voltages applied to the first impurity layer, the second impurity layer, the first gate conductor layer, and the second gate conductor layer to perform a memory write operation, a memory erase operation, and a memory read operation, and the memory-element-including semiconductor device further includes a first wiring conductor layer disposed, in plan view, in the dynamic flash memory region, connecting to the second impurity layer of each dynamic flash memory cell, and extending parallel to the substrate, and a high-thermal-conductivity material layer positioned higher than the first wiring conductor layer (first invention).

The device is configured to perform the memory write operation of an operation of generating, within the semiconductor pillar, an electron group and a hole group due to an impact ionization phenomenon caused by a current flowing between the first impurity layer and the second impurity layer or a gate induced drain leakage current and discharging, of the generated electron group and hole group, the electron group or hole group serving as minority carriers from the semiconductor pillar to cause the hole group or electron group serving as majority carriers to remain in the semiconductor pillar and the memory erase operation of discharging the hole group or electron group serving as majority carriers from the semiconductor pillar (second invention).

In the first invention, the high-thermal-conductivity material layer is a layer formed of metal or alloy and the high-thermal-conductivity material layer is connected to a ground voltage (third invention).

In the first invention, the device further includes a first connection wiring layer connecting to a portion of the source line wiring layer, extending, in plan view, in one or both of a first direction and a second direction orthogonal to the first direction, and formed of alloy or metal, wherein the first connection wiring layer connects, outside of the dynamic flash memory region, to a lead-out wiring layer extending in the direction perpendicular to the substrate, and the first connection wiring layer has an upper-surface position lower than a lower end of the bit line wiring layer (fourth invention).

In the fourth invention, the upper-surface position of the first connection wiring layer is lower than a lower-surface position of the first gate conductor layer (fifth invention).

In the first invention, a first gate capacitance between the first gate conductor layer and the semiconductor pillar is higher than a second gate capacitance between the second gate conductor layer and the semiconductor pillar (sixth invention).

In the first invention, the first impurity layer and the second impurity layer are N-type semiconductor layers containing a large amount of a donor impurity and the semiconductor pillar is a P-type semiconductor layer containing an acceptor impurity (seventh invention).

BRIEF DESCRIPTION OF DRAWINGS

FIGS. 4AA, 4AB and 4AC are explanatory views of the read operation mechanism of a dynamic flash memory according to a first embodiment.

FIGS. 4BA, 4BB, 4BC and 4BD are explanatory views of the read operation mechanism of a dynamic flash memory according to a first embodiment.

DESCRIPTION OF EMBODIMENTS

Hereinafter, a memory-element-including semiconductor device (hereafter, referred to as a dynamic flash memory) according to the present invention will be described with reference to drawings.

First Embodiment

Figure 1:
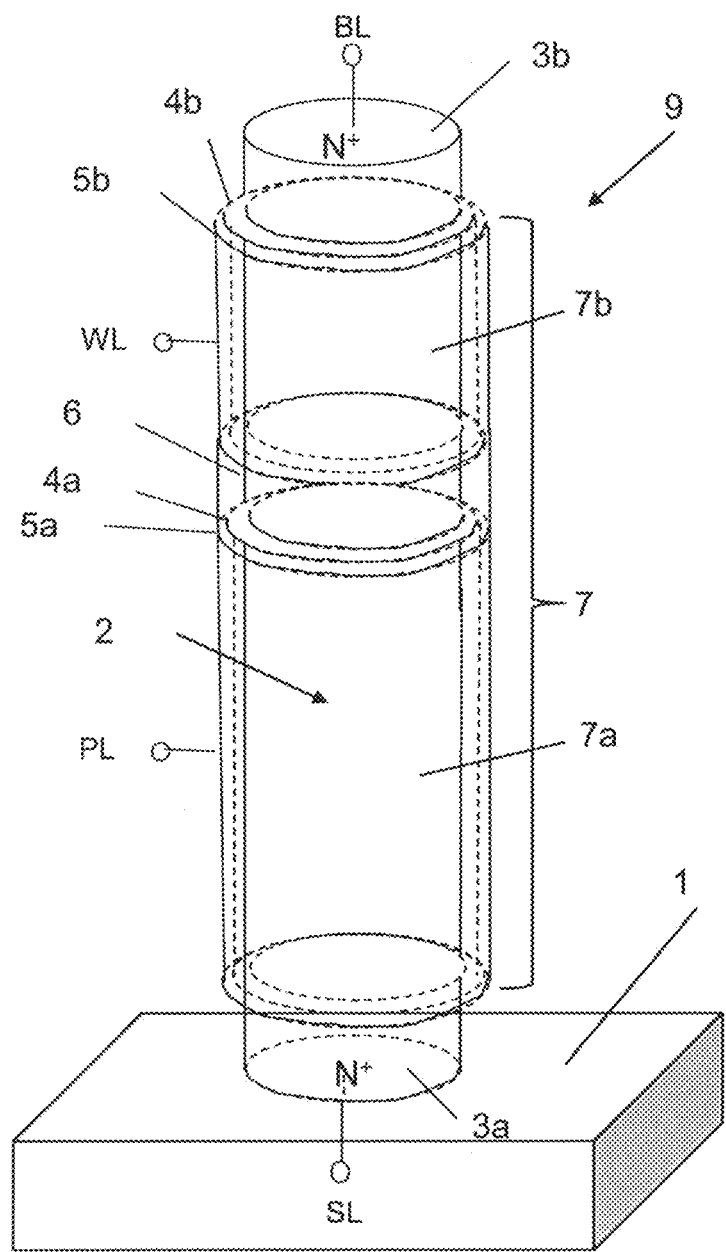
FIG. 1 is a structural view of a dynamic flash memory cell according to a first embodiment.
Figure 5A:
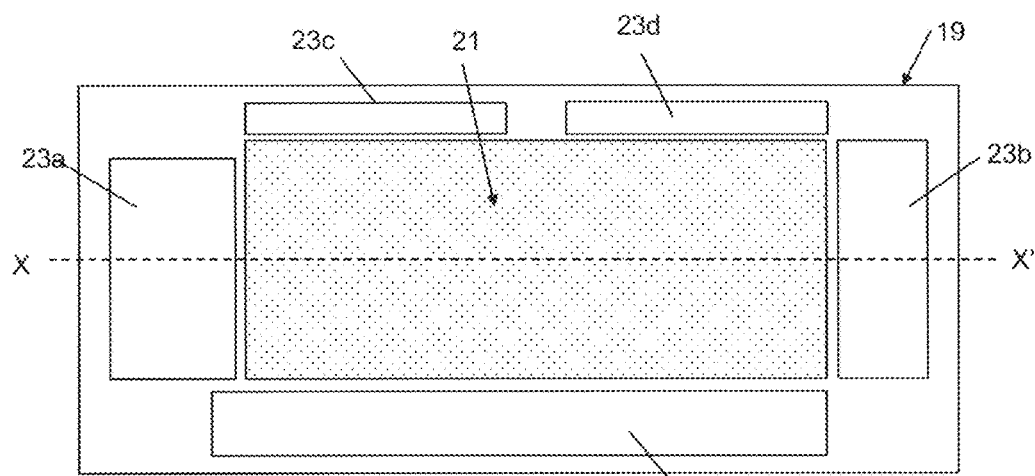
FIGS. 5A and 5B are explanatory views of dynamic flash memory cells and driving and signal processing circuits formed on the same substrate according to a first embodiment.
Figure 5B:
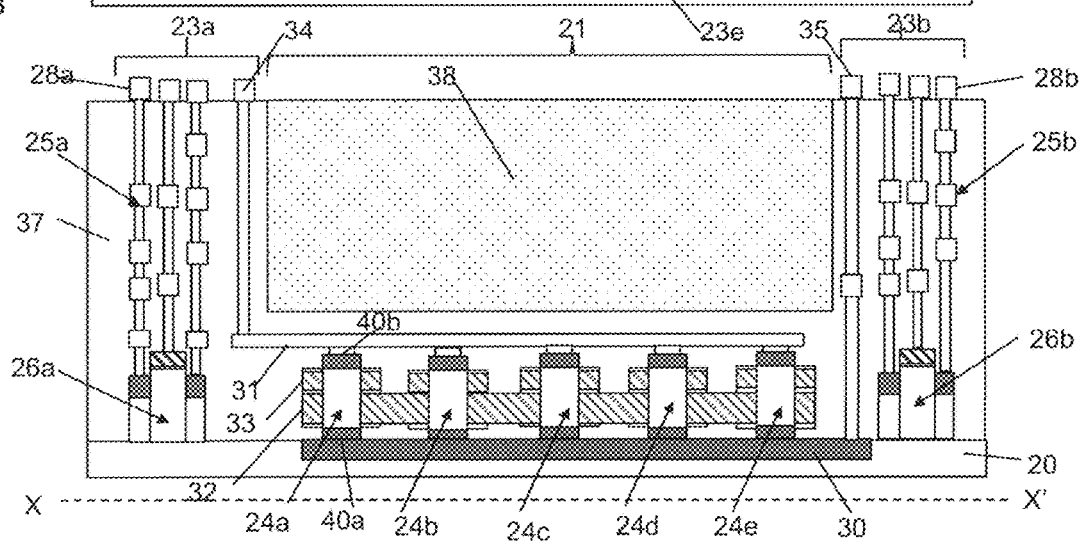

FIG. 1 to FIGS. 5A and 5B will be used to describe a dynamic flash memory cell according to a first embodiment of the present invention in terms of structure and operation mechanisms. FIG. 1 will be used to describe the structure of the dynamic flash memory cell. Subsequently, FIGS. 2A-2C will be used to describe the data erase mechanism; FIGS. 3A-3C will be used to describe the data write mechanism; FIGS. 4AA-4AC and FIGS. 4BA-4BD will be used to describe the data write mechanism. FIGS. 5A and 5B will be used to describe the structure of the dynamic-flash-memory-including memory device.

FIG. 1 illustrates the structure of a dynamic flash memory cell according to the first embodiment of the present invention. On a substrate 1 (serving as an example of "substrate" in CLAIMS), upwardly, a P-type conductivity type silicon pillar 2 (serving as an example of "first semiconductor pillar" in CLAIMS) (hereafter, silicon pillars will be referred to as "Si pillars"), an N$^+$ layer 3a (serving as an example of "first impurity layer" in CLAIMS) connecting to the bottom portion of the Si pillar 2, and an N$^+$ layer 3b (serving as an example of "second impurity layer" in CLAIMS) connecting to the top portion of the Si pillar 2 are formed. One of the N$^+$ layer 3a and the N$^+$ layer 3b serves as the source while the other serves as the drain. These serve as the source and the drain. The Si pillar 2 between the N$^+$ layers 3a and 3b serves as a channel region 7. A first gate insulating layer 4a (serving as an example of "first gate insulating layer" in CLAIMS) surrounding the lower portion of the Si pillar 2, and a second gate insulating layer 4b (serving as an example of "second gate insulating layer" in CLAIMS) surrounding the upper portion of the Si pillar 2 are formed. These first gate insulating layer 4a and the second gate insulating layer 4b are respectively disposed in contact with or near the N$^+$ layers 3a and 3b serving as the source and the drain. A first gate conductor layer 5a (serving as an example of "first gate conductor layer" in CLAIMS) surrounding the first gate insulating layer 4a, and a second gate conductor layer 5b (serving as an example of "second gate conductor layer" in CLAIMS) surrounding the second gate insulating layer 4b are individually formed. The first gate conductor layer 5a and the second gate conductor layer 5b are isolated from each other by an insulating layer 6 (serving as an example of "first insulating layer" in CLAIMS). The channel region 7, which is the Si pillar 2 between the N$^+$ layers 3a and 3b, is constituted by a first channel region 7a surrounded by the first gate insulating layer 4a, and a second channel region 7b surrounded by the second gate insulating layer 4b. Thus, the N$^+$ layers 3a and 3b serving as the source and the drain, the channel region 7, the first gate insulating layer 4a, the second gate insulating layer 4b, the first gate conductor layer 5a, and the second gate conductor layer 5b constitute a dynamic flash memory cell 9. The N$^+$ layer 3a is connected to a source line SL (serving as an example of "source line" in CLAIMS); the N$^+$ layer 3b is connected to a bit line BL (serving as an example of "bit line" in CLAIMS); the first gate conductor layer 5a is connected to a plate line PL (serving as an example of "first driving control line" in CLAIMS); the second gate conductor layer 5b is connected to a word line WL (serving as an example of "word line" in CLAIMS).

Figure 2A:
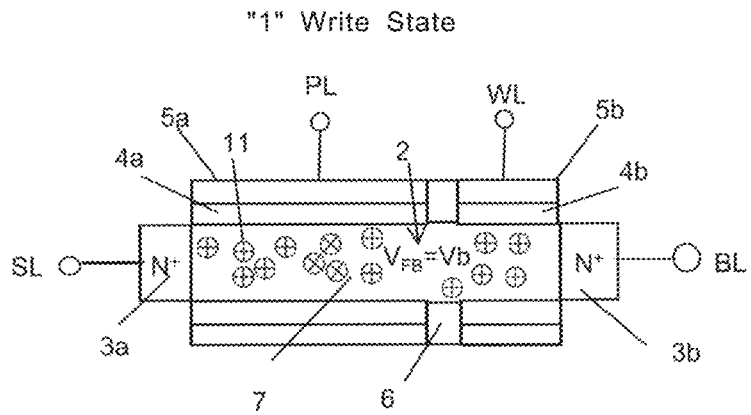
FIGS. 2A, 2B and 2C are explanatory views of the erase operation mechanism of a dynamic flash memory according to a first embodiment.
Figure 2B:
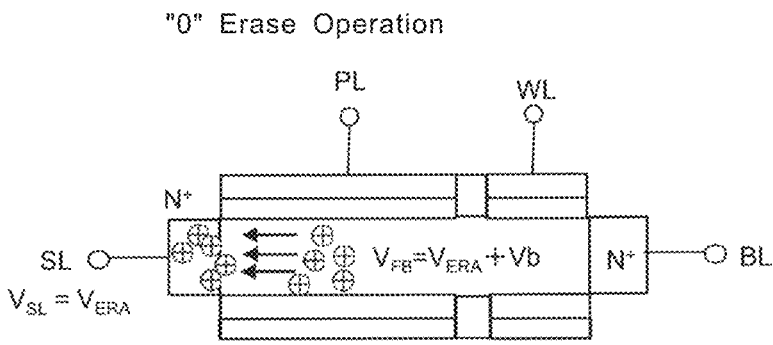
Figure 2C:
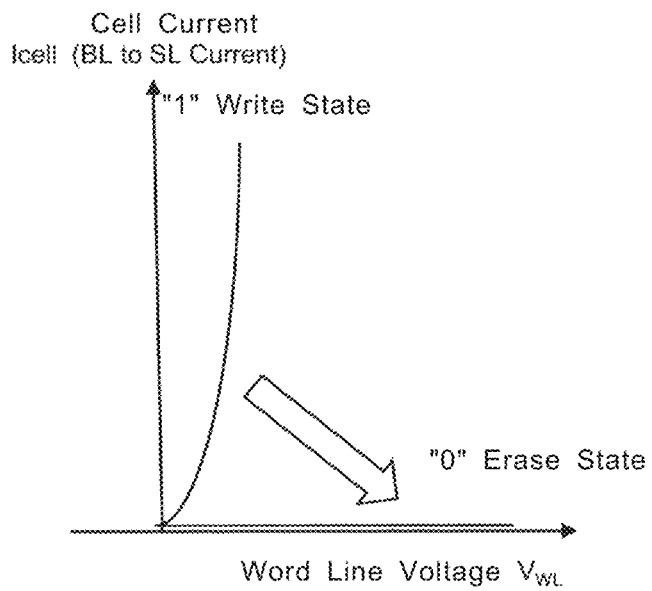

Referring to FIGS. 2A-2C, the erase operation mechanism will be described. The channel region 7 between the N$^+$ layers 3a and 3b is electrically isolated from the substrate to serve as a floating body. FIG. 2A illustrates a state in which, prior to the erase operation, a hole group 11 generated by impact ionization in the previous cycle is stored in the channel region 7. As illustrated in FIG. 2B, at the time of the erase operation, the voltage of the source line SL is set to a negative voltage $V_{ERA}$. As a result, the hole group 11 generated in the previous cycle by impact ionization and stored in the channel region 7 is drawn into the N$^+$ layer 3a serving as the source region, and discharged. This results in, as illustrated in FIG. 2C, an increase in the threshold voltage of the second gate conductor layer 5b to which the word line WL is connected. This erase state of the channel region 7 is assigned to logical storage data "0". In data reading, the voltage applied to the first gate conductor layer 5a connecting to the plate line PL is set to be higher than the threshold voltage at the time of logical storage data "1" and to be lower than the threshold voltage at the time of logical storage data "0", to thereby provide, as illustrated in FIG. 2C, a property in which, in reading of logical storage data "0", in spite of setting the word line WL to a high voltage, no current flows. This erase state of the channel region 7 is assigned to logical storage data "0". Note that the conditions of voltages applied to the bit line BL, the source line SL, the word line WL, and the plate line PL are an example for performing the erase operation; other operation conditions for performing the erase operation may be employed.

Figure 3A:
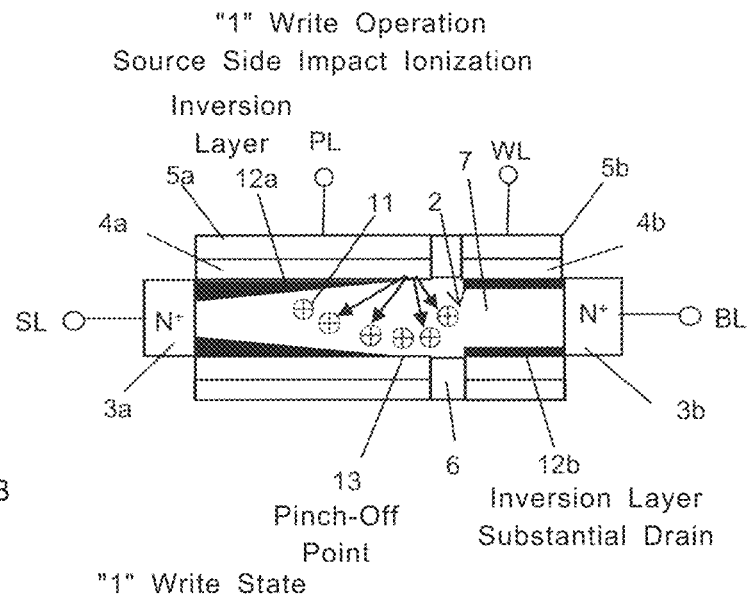
FIGS. 3A, 3B and 3C are explanatory views of the write operation mechanism of a dynamic flash memory according to a first embodiment.
Figure 3B:
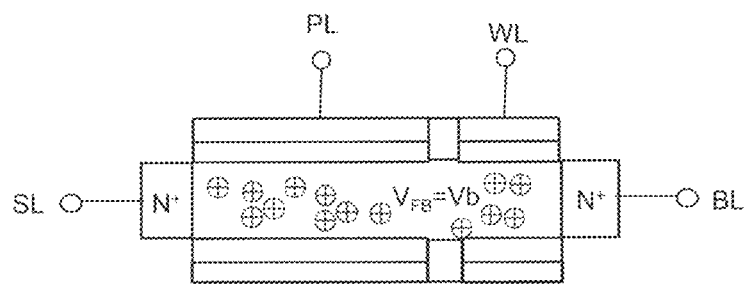
Figure 3C:
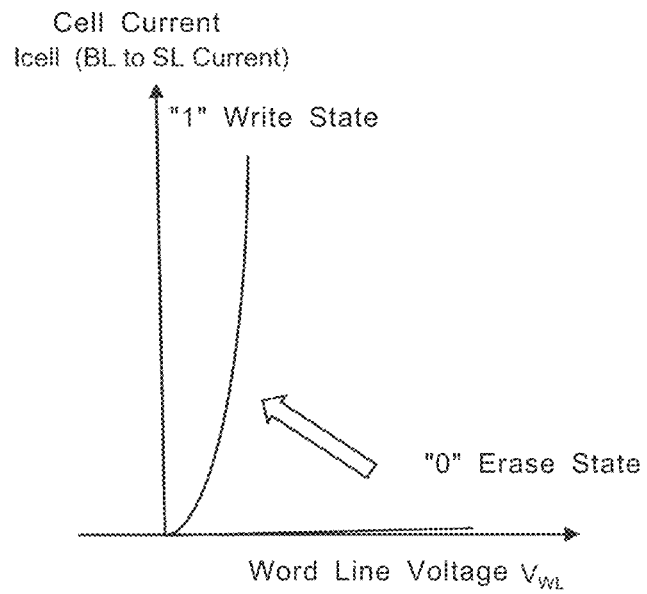

FIGS. 3A-3C illustrate the write operation of the dynamic flash memory cell according to the first embodiment of the present invention. As illustrated in FIG. 3A, for example, 0 V is applied to the N$^+$ layer 3a to which the source line SL is connected; for example, 3 V is applied to the N$^+$ layer 3b to which the bit line BL is connected; for example, 2 V is applied to the first gate conductor layer 5a to which the plate line PL is connected; for example, 5 V is applied to the second gate conductor layer 5b to which the word line WL is connected. As a result, as illustrated in FIG. 3A, in the inner region relative to the first gate conductor layer 5a to which the plate line PL is connected, an inversion layer 12a is formed and, at an end of the inversion layer 12a, a pinch-off point 13 is formed. On the other hand, in the inner region relative to the second gate conductor layer 5b to which the word line WL is connected, without the presence of the pinch-off point, an inversion layer 12b over the entire surface is formed. This results in, in the boundary region between the first gate conductor layer 5a and the second gate conductor layer 5b, an impact ionization phenomenon, to generate a large number of electron-hole pairs. A portion of the generated electrons flows to the first gate conductor layer 5a and the second gate conductor layer 5b, but most of the generated electrons flow to the N$^+$ layer 3b to which the bit line BL is connected. In writing of "1", gate induced drain leakage current (GIDL (Gate Induced Drain Leakage) current) may be used to generate electron-hole pairs (refer to NPL 11), to cause the generated hole group to fill the floating body FB. Note that generation of electron-hole pairs due to the impact ionization phenomenon can also be caused at the boundary between the N$^+$ layer 3a and the channel region 7 or the boundary between the N$^+$ layer 3b and the channel region 7.

As illustrated in FIG. 3B, the generated hole group 11 charges the channel region 7 to a positive bias. The threshold voltage of the channel region 7 decreases due to the substrate bias effect. This results in, as illustrated in FIG. 3C, a decrease in the threshold voltage of the N channel MOS transistor of the second channel region 7b to which the word line WL is connected. This write state of the channel region 7 is assigned to logical storage data "1".

Referring to FIGS. 4AA-4AC and FIGS. 4BA-4BD, the dynamic flash memory cell according to the first embodiment of the present invention will be described in terms of read operation. Referring to FIG. 4AA to FIG. 4AC, the read operation of the dynamic flash memory cell will be described. As illustrated in FIG. 4AA, charging of the channel region 7 to the built-in voltage Vb (about 0.7 V) results in a decrease in the threshold voltage of the N channel MOS transistor due to the substrate bias effect. This state is assigned to logical storage data "1". As illustrated in FIG. 4AB, when the memory block selected prior to writing is in an erase state "0" in advance, the channel region 7 is at a floating voltage $V_{FB}$ equal to $V_{ERA}$+Vb. The write operation causes random storage of write state "1". This results in, for the word line WL, generation of logical storage data of logical "0" and "1". As illustrated in FIG. 4AC, the difference between the two threshold voltages for the word line WL is used to perform reading using a sense amplifier. In data reading, the voltage applied to the first gate conductor layer 5a connecting to the plate line PL is set to be higher than the threshold voltage at the time of logical storage data "1" and to be lower than the threshold voltage at the time of logical storage data "0", to thereby provide, as illustrated in FIG. 4AC, a property in which, in reading of logical storage data "0", in spite of setting the word line WL to a high voltage, no current flows.

Referring to FIG. 4BA to FIG. 4BD, for the dynamic flash memory cell according to the first embodiment of the present invention, at the time of the read operation, the first gate conductor layer 5a and the second gate conductor layer 5b will be described in terms of the magnitude relation of the two gate capacitances and their related operations. As illustrated in FIG. 4BA, the perpendicular length of the first gate conductor layer 5a is set to be larger than the perpendicular length of the second gate conductor layer 5b, to thereby make the gate capacitance of the second gate conductor layer 5b be lower than the gate capacitance of the first gate conductor layer 5a. FIG. 4BB illustrates the equivalent circuit of the single cell of the dynamic flash memory; FIG. 4BC illustrates the coupling capacitance relation of the dynamic flash memory where $C_{WL}$ is the capacitance of the second gate conductor layer 5b, $C_{PL}$ is the capacitance of the first gate conductor layer 5a, $C_{BL}$ is the capacitance of the PN junction between the N+ layer 3b serving as the drain and the second channel region 7b, and $C_{SL}$ is the capacitance of the PN junction between the N+ layer 3a serving as the source and the first channel region 7a. As illustrated in FIG. 4BD, when the voltage of the word line WL changes, its operation affects, as noise, the channel region 7. At this time, the potential change $\Delta V_{FB}$ of the channel region 7 is expressed as follows.

$$\Delta V_{FB}=C_{WL}/(C_{PL}+C_{WL}+C_{BL}+C_{SL})\times V_{ReadWL} \quad (1)$$

where $V_{ReadWL}$ is the changing potential of the word line WL at the time of reading. As is clear from Formula (1), relative to the total capacitance $C_{PL}+C_{WL}+C_{BL}+C_{SL}$ of the channel region 7, a decrease in the contribution ratio of $C_{WL}$ results in a decrease in $\Delta V_{FB}$. Thus, the perpendicular length of the first gate conductor layer 5a to which the plate line PL connects can be made even larger than the perpendicular length of the second gate conductor layer 5b to which the word line WL connects, to thereby achieve, without a decrease in the degree of integration of the memory cell in plan view, a further decrease in $\Delta V_{FB}$.

Referring to FIGS. 5A and 5B, memory cells of the dynamic flash memory according to this embodiment, a driving circuit and a signal processing circuit used for the memory cells and formed on the same substrate will be described. For the driving circuit and the signal processing circuit, for example, a planar MOSFET, a Fin transistor (refer to, for example, NPL 12), a GAA transistor (refer to, for example, NPL 13), a Nanosheet transistor (refer to, for example, NPL 14), or an SGT transistor is used. FIG. 5A is a plan view for illustrating the circuit configuration within the dynamic-flash-memory-including semiconductor device. FIG. 5B is a sectional view taken along line X-X' in FIG. 5A.

As illustrated in FIG. 5A, a dynamic-flash-memory-including semiconductor device region 19 includes a dynamic flash memory cell region 21 in which dynamic flash memory cells are arranged in a two-dimensional array and driving-signal processing circuit regions 23a, 23b, 23c, 23d, and 23e disposed around the periphery of the dynamic flash memory cell region 21. Note that, in a case where a plurality of block regions including a plurality of dynamic flash memory cell regions 21 are formed on the same semiconductor chip, in each of the block regions, the dynamic flash memory cell region 21 and the driving-signal processing circuit regions 23a, 23b, 23c, 23d, and 23e around the dynamic flash memory cell region 21 are disposed.

As illustrated in FIG. 5B, on a semiconductor substrate 20, dynamic flash memory cell transistors 24a, 24b, 24c, 24d, and 24e and driving-signal processing circuit transistors 26a and 26b are disposed. N+ layers 40a in the bottom portions of the memory cell transistors 24a to 24e connect to a source line wiring layer 30. N+ layers 40b in the top portions of the memory cell transistors 24a to 24e connect to a bit line wiring layer 31. A plate line wiring layer 32 and a word line wiring layer 33 (also formed for the other cell transistors 24b to 24e, not shown) are disposed. The word line wiring layer 33 is formed so as to be orthogonal to, in plan view, the bit line wiring layer 31. The source line wiring layer 30 is led out, from a region outside of the dynamic flash memory cell region 21, to the upper-layer portion in the perpendicular direction, to connect to a source line lead-out wiring layer 35. The bit line wiring layer 31 is led out, from a region outside of the dynamic flash memory cell region 21, to the upper-layer portion in the perpendicular direction, to connect to a bit line lead-out wiring layer 34. The plate line wiring layer 32 and the word line wiring layer 33 are led out, in plan view, from a region outside of the dynamic flash memory cell region, to an upper-layer portion in the perpendicular direction (not shown). Note that FIG. 5B illustrates, as memory cell transistors in the dynamic flash memory cell region, five memory cell transistors 24a to 24e; however, the memory cell transistors are arranged in a two-dimensional array within the dynamic flash memory cell region 21. Similarly, the driving-signal processing circuits have been described using the two transistors 26a and 26b; however, the transistors of the driving-signal processing circuits are arranged in two-dimensional arrays within the driving-signal processing circuit regions.

As illustrated in FIG. 5B, in the driving-signal processing circuit regions 23a to 23e, for example, planar MOSFETs, Fin transistors, GAA transistors, or SGT transistors are used to form driving-signal processing transistors 26a and 26b. The terminal portions of the driving-signal processing transistors 26a and 26b connect, via multilayered wiring layers 25a and 25b, in the perpendicular direction and are led out to the upper wiring layers 28a and 28b. In the dynamic flash memory cell region 21, the uppermost surface of the wiring layers is at the bit line wiring layer 31. On the other hand, in the driving-signal processing circuit regions 23a to 23e, the uppermost surfaces of the wiring layers are at upper-layer-portion wiring layers 28a and 28b, the bit line lead-out wiring layer 34, and the source line lead-out wiring layer 35. Similarly, in the outside of the dynamic flash memory cell region 21, the plate line lead-out wiring layer (not shown) and the word line lead-out wiring layer (not shown) have uppermost surfaces formed also at the same height as the upper wiring layers 28a and 28b, the bit line lead-out wiring layer 34, and the source line lead-out wiring layer 35. The driving-signal processing circuit regions 23a to 23e are formed as various types of high-density logic circuits and hence regions between the terminal portions of the driving-signal processing transistors 26a and 26b and the upper wiring layers 28a and 28b have multilayered wiring layers 25a and 25b constituted by multiple layers. This results in, in the perpendicular direction, a large height difference between the bit line wiring layer 31 and the upper wiring layers 28a and 28b, the bit line lead-out wiring layer 34, and the source line lead-out wiring layer 35. An insulating layer 37 is disposed so as to surround the dynamic flash memory cell transistors 24a, 24b, 24c, 24d, and 24e and the driving-signal processing circuit transistors 26a and 26b. The wiring layers 25a, 25b, 28a, 28b, 34, and 35 are disposed on the insulating layer 37. In the whole region of the dynamic flash memory cell region 21, a high-thermal-conductivity layer 38 of, for example, copper (Cu) is formed so as to fill an upper portion above the bit line wiring layer 31, to the upper-surface position of the insulating layer 37. This high-thermal-conductivity layer 38 has the role of a heat-sink layer.

Note that, even when the Si pillar 2 in FIG. 1 has a horizontal sectional shape that is circular, elliptical, or rectangular, the dynamic flash memory operation described in this embodiment can be performed. On the same chip, dynamic flash memory transistors having circular, elliptical, and rectangular shapes may together be disposed.

For FIG. 1, it has been stated that the first gate conductor layer 5a connects to the plate line PL and the second gate conductor layer 5b connects to the word line WL. Alternatively, even when the first gate conductor layer 5a connects to the word line WL and the second gate conductor layer 5b connects to the plate line PL, normally the dynamic flash memory operation can be performed. Similarly, for FIG. 1, it has been stated that the N$^+$ layer 3a connects to the source line SL and the N$^+$ layer 3b connects to the bit line BL; alternatively, even when the N$^+$ layer 3a is connected to the bit line BL and the N$^+$ layer 3b is connected to the source line SL, normally the dynamic flash memory operation can be performed.

In FIGS. 5A and 5B, the high-thermal-conductivity layer 38 is formed of alloy, metal, or another high-thermal-conductivity material.

In FIGS. 5A and 5B, the substrate 20 may be formed as a P-type semiconductor layer, SOI (Silicon On Insulator), or a monolayer or a multilayer of Si or another semiconductor material. The substrate 20 may be a well layer constituted by a monolayer or a multilayer of N layers or P layers.

In FIG. 1, the first gate conductor layer 5a surrounds the entirety of the first gate insulating layer 4a. Alternatively, a structure in which the first gate conductor layer 5a surrounds, in plan view, a portion of the first gate insulating layer 4a may be employed. In this case, the outside of the first gate insulating layer not covered by the first gate conductor layer 5a may be covered by an insulating layer or a third gate conductor layer electrically isolated from the first gate conductor layer. Note that, in the case of disposing the third gate conductor layer, to the third gate conductor layer, a constant voltage or a pulse voltage can be applied, to perform the dynamic flash memory operation. As described above, in plan view, in the structure in which the first gate conductor layer 5a surrounds a portion of the first gate insulating layer 4a, a large number of hole groups can be stored in the first channel region 7a.

FIG. 1 has been described using the N$^+$ layers 3a and 3b and the Si pillar 2 including the channel region 7 of the P-type. Alternatively, the N$^+$ layers 3a and 3b may be replaced by P$^+$ layers and the Si pillar 2 may be changed from the P layer to an N layer. In this case, a memory write operation of an operation of causing an impact ionization phenomenon or a gate induced drain leakage current to generate an electron group and a hole group, discharging, of the generated electron group and hole group, the hole group serving as minority carriers from one or both of the P$^+$ layers serving as the source and the drain, and causing a portion of or the entirety of the electron group serving as majority carriers to remain within the Si pillar 2, and a memory erase operation of removing, from one or both of the P$^+$ layers serving as the source and the drain, the remaining electron group of the electron group are performed. In this way, the dynamic flash memory operation is also performed.

This embodiment provides the following features.

(Feature 1)

When the dynamic flash memory cell according to the first embodiment of the present invention performs the write or read operation, the voltage of the word line WL changes up and down; at this time, the plate line PL plays the role of reducing the capacitive coupling ratio between the word line WL and the channel region 7. As a result, during up-and-down changes in the voltage of the word line WL, the effect due to the changes in the voltage in the channel region 7 can be considerably suppressed. As a result, the difference between the threshold voltages of the SGT transistor for the word line WL indicating logical "0" and "1" can be made to be large. This leads to an increase in the operation margin of the dynamic flash memory cell.

(Feature 2)

As illustrated in FIGS. 5A and 5B, by using the height difference between the bit line wiring layer 31 of the dynamic flash memory cell region 21 and the upper wiring layers 28a and 28b, the bit line lead-out wiring layer 34, the source line lead-out wiring layer 35, the plate line lead-out wiring layer (not shown), and the word line lead-out wiring layer (not shown) of the driving-signal processing circuit regions 23a to 23e, a high-volume high-thermal-conductivity layer 38 can be formed over the entirety of the dynamic flash memory cell region 21. This high-thermal-conductivity layer 38 serves as a good heat sink. In particular, with an increase in the speed of and an increase in the density of the circuit, it is very important to suppress the increase in the circuit temperature. This provides a high-performance dynamic-flash-memory-including semiconductor device.

(Feature 3)

As the high-thermal-conductivity layer 38, ordinarily, an alloy layer or a metal layer is employed. This high-thermal-conductivity layer 38 is connected to the ground voltage, so that the high-thermal-conductivity layer 38 serves as a good electrostatic shielding layer. This contributes to a stable operation of the dynamic-flash-memory-including semiconductor device.

Second Embodiment

Figure 6A:
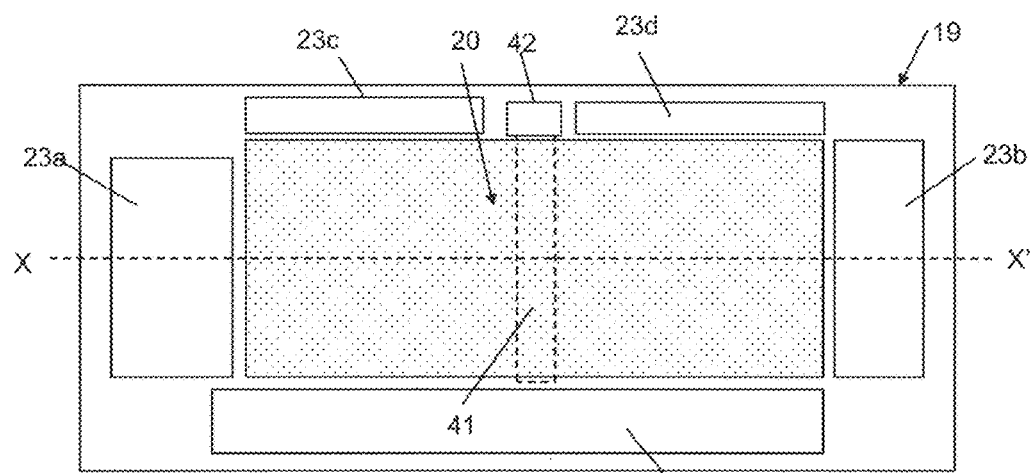
FIGS. 6A and 6B are explanatory views of dynamic flash memory cells and driving and signal processing circuits formed on the same substrate according to a second embodiment.
Figure 6B:
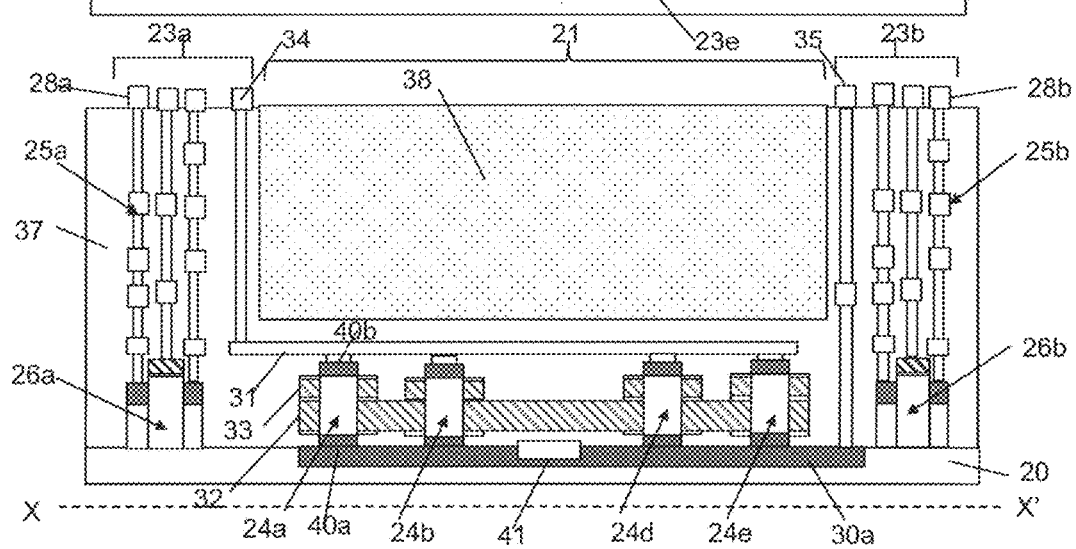

Referring to FIGS. 6A and 6B, a dynamic flash memory circuit and a driving circuit and a signal processing circuit used for the memory cells, the circuits being formed on the same substrate 20, will be described. FIG. 6A is a plan view for illustrating the circuit configuration within the dynamic-flash-memory-including semiconductor device. FIG. 6B is a sectional view taken along line X-X' in FIG. 6A. In FIGS. 6A and 6B, the same elements as in FIGS. 5A and 5B are denoted by like reference signs. The source line wiring layer 30 is formed as an $N^+$ layer 30a. Of the memory cell transistors 24a to 24e in FIGS. 5A and 5B, the memory cell transistor 24c and the memory cell transistors disposed in a direction orthogonal to line X-X' in FIG. 6A so as to connect to the memory cell transistor 24c are not disposed. In the place where the memory cell transistors are not disposed, on the $N^+$ layer 30a, a conductor layer 41 formed of, for example, W is formed. This conductor layer 41 extends in a direction orthogonal to line X-X', and is led out, to the outside of the dynamic flash memory region, in the source line lead-out portion 42, using a connection wiring layer (not shown) formed in the perpendicular direction to the upper surface of the insulating layer 37. The conductor layer 41 has an upper-surface position lower than the lower-end position of the plate line wiring layer 32. Note that a plurality of conductor layers 41 are formed, in accordance with the specifications of the semiconductor device, so as to extend in one or both of the line X-X' direction and the direction orthogonal to the line X-X' direction. In the outer periphery region of the $N^+$ layer 30a surrounding the dynamic flash memory region, a conductor layer such as a W layer is disposed. In the case of disposing, in the outer periphery region around the dynamic flash memory region, the conductor layer, the conductor layer in the outer periphery region and the conductor layer 41 can be connected together, so that one of the source line lead-out wiring layer 35 and the source line lead-out portion 42 may be omitted.

This embodiment provides the following feature.

When the source line wiring layer 30 is formed as the $N^+$ layer 30a, the electric resistance between the source line lead-out wiring layer 35 and the bottom-portion $N^+$ layers of the memory cell transistors 24a, 24b, 24d, and 24e leads to a decrease in the operation speed of the dynamic flash memory and a decrease in the operation margin. By contrast, the conductor layer 41 is formed, on the $N^+$ layer 30a, to the outside of the dynamic flash memory region, under and along the plate line wiring layer 32, to thereby achieve a decrease in the electric resistance between the source line lead-out wiring layer 35 and the bottom-portion $N^+$ layers of the memory cell transistors. As a result, while a heat-sink conductor layer 38 having a large volume is maintained, an increase in the operation speed of the dynamic flash memory and an increase in the operation margin can be achieved.

Third Embodiment

Figure 7A:
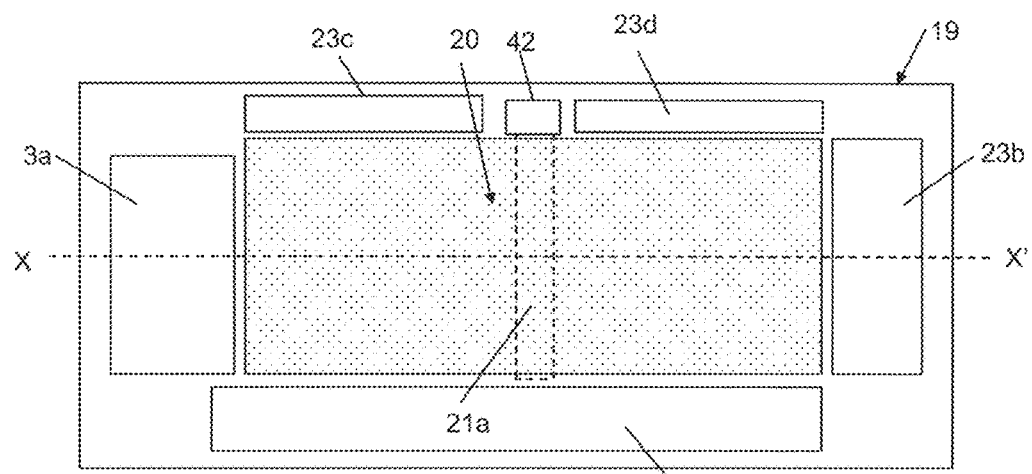
FIGS. 7A and 7B includes explanatory views of dynamic flash memory cells and driving and signal processing circuits formed on the same substrate according to a third embodiment.
Figure 7B:
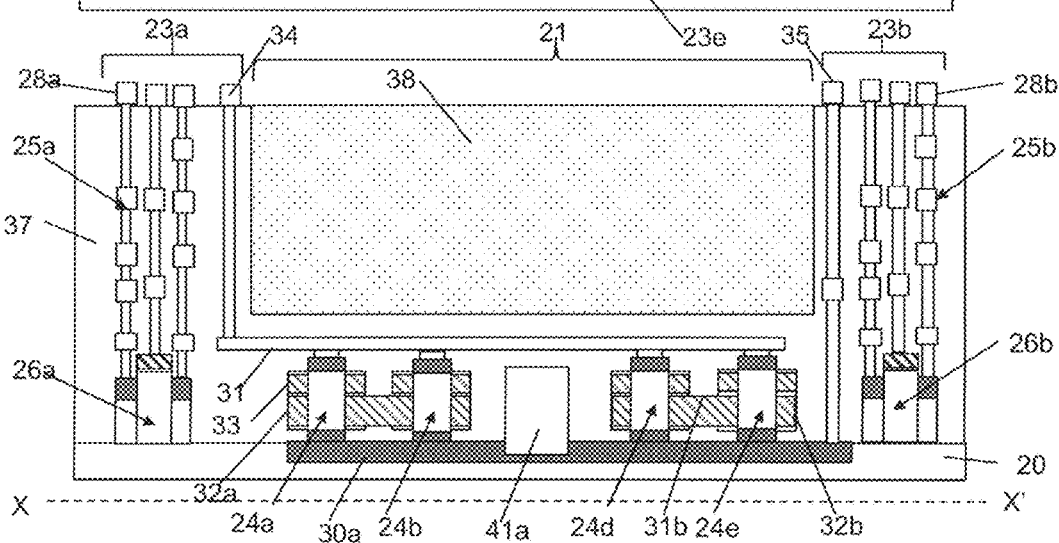
Figure 8A:
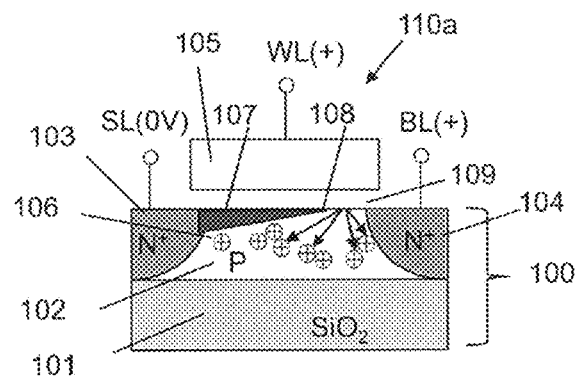
FIGS. 8A, 8B, 8C and 8D are explanatory views of a problem in the operation of a related-art capacitor-less DRAM memory cell.
Figure 8B:
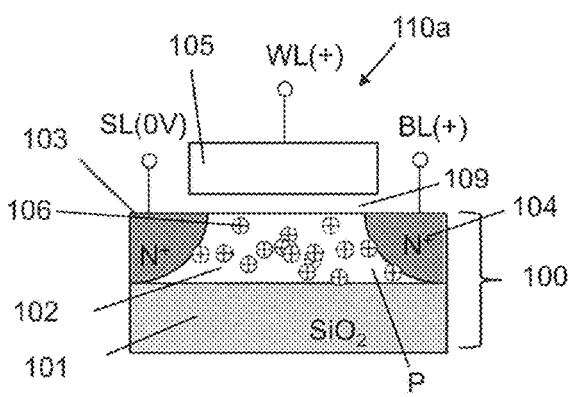
Figure 8C:
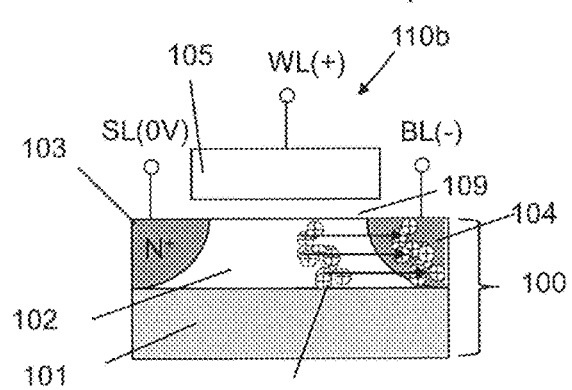
Figure 8D:
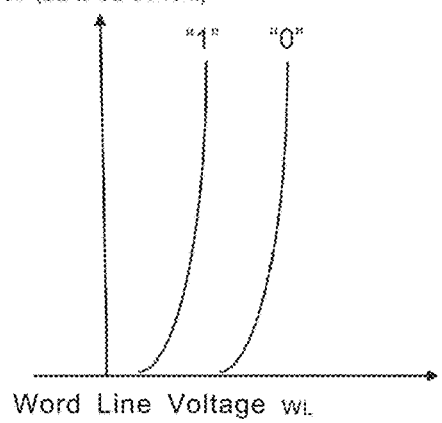
Figure 9A:
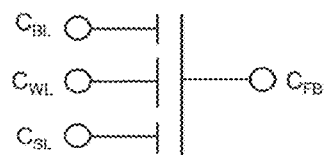
FIGS. 9A and 9B are explanatory views of a problem in the operation of a related-art capacitor-less DRAM memory cell.
Figure 9B:
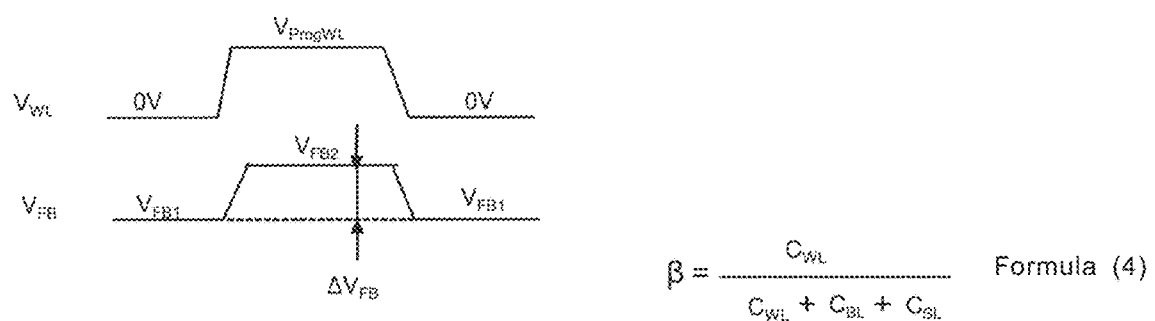
Figure 10A:
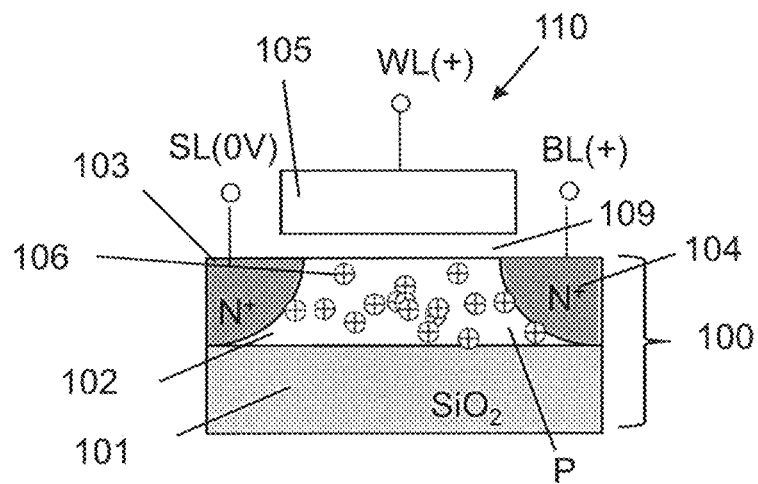
FIGS. 10A, 10B and 10C are the read operation of a related-art capacitor-less DRAM memory cell.
Figure 10B:
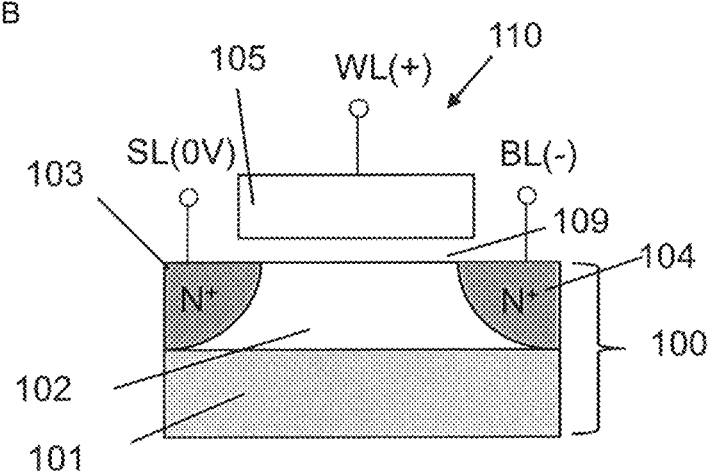
Figure 10C:
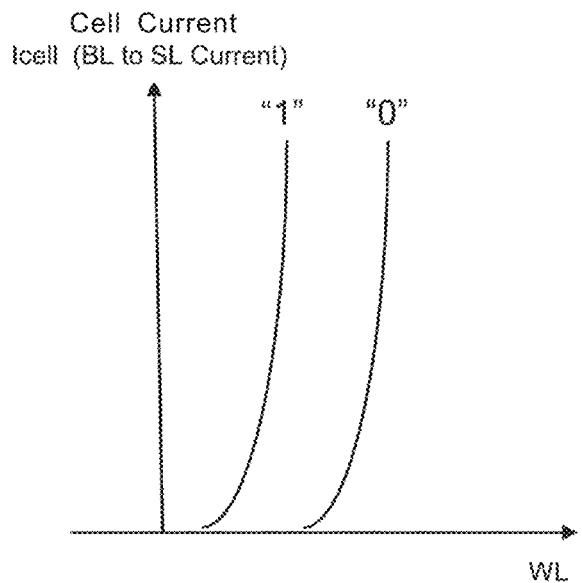

Referring to FIGS. 7A and 7B, a dynamic flash memory circuit and a driving circuit and a signal processing circuit for the memory cells, the circuits being formed on the same substrate 20, will be described. FIG. 7A is a plan view for illustrating the circuit configuration within the dynamic-flash-memory-including semiconductor device. FIG. 7B is a sectional view taken along line X-X' in FIG. 7A. In FIGS. 7A and 7B, the same elements as in FIGS. 5A and 5B, and FIGS. 6A and 6B are denoted by like reference signs. As illustrated in FIG. 7B, the plate line wiring layer 32 in FIGS. 6A and 6B are divided into plate line wiring layers 32a and 32b. In plan view, on the $N^+$ layer between the memory cell transistors 24b and 24d, instead of the W layer 41 in FIGS. 6A and 6B, a W layer 41a is disposed. This W layer 41a has an upper-surface position higher than the lower-end position of the plate line wiring layer 32, and lower than the lower end of the bit line wiring layer 31. Note that the plate line wiring layers 32a and 32b connect outside of the dynamic flash memory region. The other configuration is the same as in the embodiment illustrated in FIGS. 6A and 6B.

This embodiment provides the following feature.

The W layer 41a has a larger height than the W layer 41 in FIGS. 6A and 6B, to thereby make the electric resistance of the W layer 41a be even lower than the electric resistance of the W layer 41. This enables a further reduction in the electric resistance between the source line lead-out wiring 35 and the bottom-portion $N^+$ layers of the memory cell transistors 24a, 24b, 24d, and 24e, which leads to a further increase in the operation speed of and a further increase in the operation margin of the dynamic flash memory.

Other Embodiments

Note that, in the first embodiment, the Si pillar 2 is formed; alternatively, other semiconductor materials may be used to form semiconductor pillars.

In the first embodiment, the Si pillar 2 has a plan-view shape that is circular. Alternatively, the Si pillar 2 may have a plan-view shape that is circular, elliptical, or elongated in one direction, for example. Also in the signal processing-driving circuit region formed apart from the dynamic flash memory cell region, depending on the logic circuit design used for that, Si pillars different in plan-view shapes can be formed in combination to form an SGT and a Fin transistor. The same applies to other embodiments according to the present invention.

FIG. 1 has been described using the Si pillar having a rectangular section; alternatively, it may be trapezoidal. In the Si pillar 2 in the dynamic flash memory cell, the section of the Si pillar 2 surrounded by the first gate insulating layer 4a and the section of the Si pillar 2 surrounded by the second gate insulating layer 4b may be different and respectively rectangular and trapezoidal. The same applies to other embodiments according to the present invention.

In FIGS. 5A and 5B, the source line wiring layer 30 may be formed as an alloy or metal layer. The same applies to other embodiments according to the present invention.

In FIGS. 5A and 5B, the $N^+$ layers 40a of the Si pillars 24a to 24e connect to the source line wiring layer 30, but may alternatively be individually led out. In this case, the lead-out wiring lines are desirably, in plan view, orthogonal to the bit line wiring layer 31. The source line wiring layer 30 may be formed as an $N^+$ layer electrically isolated from the adjacent word line using STI (Sallow Trench Isolation) and a well structure.

In FIG. 1, the gate length of the first gate conductor layer 5a can be set to be larger than the gate length of the second gate conductor layer 5b, to thereby make the gate capacitance of the first gate conductor layer 5a be higher than the gate capacitance of the second gate conductor layer 5b. Also in a structure in which the gate length of the first gate conductor layer 5a is or is not set to be larger than the gate length of the second gate conductor layer 5b, the film thicknesses of the gate insulating layers can be changed such that the film thickness of the gate insulating film of the first gate insulating layer 4a is set to be smaller than the film thickness of the gate insulating film of the second gate insulating layer 4b, to make the gate capacitance of the first gate conductor layer 5a be even higher than the gate capacitance of the second gate conductor layer 5b. The dielectric constant of the gate insulating film of the first gate insulating layer 4a may be set to be higher than the dielectric constant of the gate insulating film of the second gate insulating layer 4b. A combination of some of the lengths of the gate conductor layers 5a and 5b, and the film thicknesses and dielectric constants of the gate insulating layers 4a and 4b may be selected such that the gate capacitance of the first gate conductor layer 5a is made even higher than the gate capacitance of the second gate conductor layer 5b. The same applies to other embodiments according to the present invention.

In FIG. 1, the P-type Si pillar 2 may be formed of an intrinsic semiconductor. The same applies to other embodiments according to the present invention.

In FIGS. 5A and 5B, the plate line wiring layer 32 is formed so as to extend through the Si pillars 24a to 24e; alternatively, as in the word line wiring layer 33, it may be divided so as to correspond to the Si pillars 24a to 24e. In this case, in plan view, the divided plate line wiring layer 32 is formed, as with the word line wiring layer 33, so as to be orthogonal to the bit line wiring layer 31.

For the present invention, without departing from the broad spirit and scope of the present invention, various embodiments and modifications can be made. The above-described embodiments are provided for the purpose of describing examples of the present invention and do not limit the scope of the present invention. The examples and modifications can be appropriately combined. In addition, the embodiments from which a portion of the features has been removed as needed also fall in the scope of the technical idea of the present invention.

INDUSTRIAL APPLICABILITY

Memory-element-including semiconductor devices according to the present invention provide high-density high-performance dynamic-flash-memory-including semiconductor devices.

The invention claimed is:

1. A memory-element-including semiconductor device comprising:
   a dynamic flash memory region in which, on a substrate, a plurality of dynamic flash memory cells are arranged in a two-dimensional array, and a signal processing-driving circuit region disposed outside of the dynamic flash memory region and including a plurality of transistors configured to perform signal processing-driving of the plurality of dynamic flash memory cells,
   wherein each of the dynamic flash memory cells included in the dynamic flash memory region includes
   a semiconductor pillar standing on the substrate in a direction perpendicular to the substrate,
   a first impurity layer connecting to a bottom portion of the semiconductor pillar,
   a second impurity layer connecting to a top portion of the semiconductor pillar,
   a first gate insulating layer surrounding a lower portion of the semiconductor pillar and being in contact with the first impurity layer,
   a second gate insulating layer being in contact with the first gate insulating layer, surrounding an upper portion of the semiconductor pillar, and being in contact with the second impurity layer,
   a first gate conductor layer covering a portion of or an entirety of the first gate insulating layer,
   a second gate conductor layer covering the second gate insulating layer, and
   a first insulating layer disposed between the first gate conductor layer and the second gate conductor layer, and
   is configured to control voltages applied to the first impurity layer, the second impurity layer, the first gate conductor layer, and the second gate conductor layer to perform a memory write operation, a memory erase operation, and a memory read operation, and
   the memory-element-including semiconductor device further comprises a first wiring conductor layer disposed, in plan view, in the dynamic flash memory region, connecting to the second impurity layer of each dynamic flash memory cell, extending parallel to the substrate, and having an upper-surface position, in the perpendicular direction, lower than an uppermost semiconductor layer of the signal processing-driving circuit region, and
   a high-thermal-conductivity material layer positioned higher than the first wiring conductor layer.

2. The memory-element-including semiconductor device according to claim 1, being configured to perform the memory write operation of an operation of generating, within the semiconductor pillar, an electron group and a hole group due to an impact ionization phenomenon caused by a current flowing between the first impurity layer and the second impurity layer or a gate induced drain leakage current and discharging, of the generated electron group and hole group, the electron group or hole group serving as minority carriers from the semiconductor pillar to cause the hole group or electron group serving as majority carriers to remain in the semiconductor pillar and the memory erase operation of discharging the hole group or electron group serving as majority carriers from the semiconductor pillar.

3. The memory-element-including semiconductor device according to claim 1, wherein the high-thermal-conductivity material layer is a layer formed of metal or alloy and the high-thermal-conductivity material layer is connected to a ground voltage.

4. The memory-element-including semiconductor device according to claim 1, further comprising a first connection wiring layer connecting to a portion of the first impurity layer, extending, in plan view, in one or both of a first direction and a second direction orthogonal to the first direction, and formed of alloy or metal,
   wherein the first connection wiring layer connects, outside of the dynamic flash memory region, to a lead-out wiring layer extending in the direction perpendicular to the substrate, and
   the first connection wiring layer has an upper-surface position lower than a lower end of the bit line wiring layer.

5. The memory-element-including semiconductor device according to claim 4, wherein the upper-surface position of the first connection wiring layer is lower than a lower-surface position of the first gate conductor layer.

6. The memory-element-including semiconductor device according to claim 1, wherein a first gate capacitance between the first gate conductor layer and the semiconductor pillar is higher than a second gate capacitance between the second gate conductor layer and the semiconductor pillar.

7. The memory-element-including semiconductor device according to claim 1, wherein the first impurity layer and the second impurity layer are N-type semiconductor layers containing a large amount of a donor impurity and the semiconductor pillar is a P-type semiconductor layer containing an acceptor impurity.

* * * * *